United States Patent [19]
Yu

[11] Patent Number: 5,073,762
[45] Date of Patent: Dec. 17, 1991

[54] LOW FREQUENCY CARRIERBAND MULTI-PORT SIGNAL COUPLER

[75] Inventor: Hong Yu, Nashua, N.H.

[73] Assignee: CaSat Technology, Inc., Amherst, N.H.

[21] Appl. No.: 616,432

[22] Filed: Nov. 21, 1990

Related U.S. Application Data

[63] Continuation-in-part of Ser. No. 277,753, Nov. 30, 1988, Pat. No. 4,973,926.

[51] Int. Cl.⁵ .............................................. H03H 7/48
[52] U.S. Cl. .................................. 333/112; 333/119; 333/131
[58] Field of Search ............... 333/100, 112, 118, 119, 333/124, 131; 455/3, 6

[56] References Cited
U.S. PATENT DOCUMENTS

| | | | |
|---|---|---|---|
| 3,832,647 | 8/1974 | Beurrier | 333/100 X |
| 3,872,408 | 3/1975 | Reilly | 333/112 |
| 4,419,636 | 12/1983 | Yu | 333/131 |
| 4,467,293 | 8/1984 | Apel | 333/112 |
| 9,973,926 | 11/1990 | Yu | 333/112 |

Primary Examiner—Paul Gensler
Attorney, Agent, or Firm—Wolf, Greenfield & Sacks

[57] ABSTRACT

A low frequency multi-port signal coupler employing hybrid transformer coupling circuitry for intercoupling from a main communication line to output taps. In one embodiment, the coupler has two tap ports interconnected by two core transformers, each having a termination resistor associated therewith. In another embodiment of the invention, there are four tap ports interconnected by three core transformers and a shunted inductor, and having three termination resistors and a split-matching isolation resistor associated with the output taps. An impedance matching resistance is provided at the input and output of the two port embodiment.

20 Claims, 11 Drawing Sheets

LOW FREQUENCY CARRIERBAND MULTI-PORT SIGNAL COUPLER

RELATED APPLICATION

This application is a continuation-in-part of application Ser. No. 07/277,753 filed Nov. 30, 1988, now U.S. Pat. No. 4,973,926 granted Nov. 27, 1990.

BACKGROUND OF THE INVENTION

The present invention relates in general to low frequency carrierband multi port signal couplers. More particularly, the invention pertains to multi-port couplers that are characterized by improved isolation, particularly between ports of the coupler, as well as having improved impedance matching characteristics.

Reference is made to the assignee's U.S. Pat. No. 4,419,636, granted Dec. 6, 1983, on a low frequency wide band signal coupler.

Carrierband local area networks are designed to provide single channel, low cost communication networks, for use in, for example, factory automated environments. These networks are primarily intended to be used as a local sub-network, typically supporting thirty to sixty nodes of communication. One problem with existing networks is that they are unduly complex in construction, requiring relatively complex and costly circuitry. Furthermore, existing networks do not provide proper impedance matching and, in particular, do not provide proper isolation between tap ports of the network.

Accordingly, it is an object of the present invention to provide an improved low frequency carrierband multi port signal coupler that is characterized by a well maintained isolation loss between tap ports.

Another object of the present invention is to provide an improved multi port coupler that has proper transmission line impedance matching so as to minimize any reflection that may occur along any point of the transmission medium.

A further object of the present invention is to provide a multi-port coupler employing a hybrid transformer coupling circuitry that is effective in reducing the component count significantly while at the same time providing reliability and high performance.

Still another object of the present invention is to provide a low frequency carrierband multi-port multi directional coupler having wide band width signal coupling, such as from 500 kilohertz (KHz) to 30 megahertz (MHz).

Another object of the present invention is to provide an improved low frequency carrierband multi port signal coupler that is characterized by providing an appropriate amount of RF energy from the main transmission line to each tap port with a minimum insertion loss introduced into the main transmission line.

Still another object of the present invention is to provide a low frequency multi-port coupler that is provided with DC isolation between the center conductor of the trunk and the taps. This provides a substantially improved noise immunity.

SUMMARY OF THE INVENTION

To accomplish the foregoing and other objects, features and advantages of the invention, there is provided a low frequency carrierband multi port and multi-directional signal coupler that is basically comprised of two major components. One component is a communication (trunk) cable that is used as a medium to transport packets of information. The other component is a multi directional tap or series of taps which provide a means for tapping a specified amount of signal from the trunk cable to the subscriber device. The coupler of the present invention preferably employs transformer coupling circuitry that is significant in reducing the number of components required, while at the same time providing reliable and high performance operation. There are basically two embodiments of the present invention described herein. From an illustrative standpoint, these embodiments are now described herein as a two port embodiment and the other as a four port embodiment. The two port embodiment preferably includes an input terminal, an output terminal, and two tap ports interconnected by two respective core transformers, each having a termination resistor associated therewith. With regard to the four port embodiment, this is preferably comprised of an input terminal, an output terminal, and four tap ports interconnected by three core transformers and a shunted inductor, and the ports having associated therewith a split matching isolation resistor and three termination resistors. In the two port embodiment, impedance matching resistors may be employed at the input and output ends of the communication line.

BRIEF DESCRIPTION OF THE DRAWINGS

Numerous other objects, features and advantages of the present invention should now become apparent upon a reading of the following detailed description, taken in conjunction with the accompanying drawings, in which.

DETAILED DESCRIPTION

There is now described herein a low frequency carrierband multi-port signal coupler that is adapted to be constructed in a bus topology and uses phase coherent FSK modulation techniques to transmit information at 5 to 10 megabits per second (Mbps) base band data rate. The network of the present invention, in one embodiment, may exhibit an energy spectrum domain from two megahertz (MHz) to twenty megahertz (MHz).

The carrierband media components are comprised primarily of two major components. One is a trunk cable used as a medium to transport packets of information. The other is a multi directional tap or series of taps which provide a means for tapping a specified amount of signal from the trunk cable to the subscriber device.

In accordance with one embodiment of the present invention, the multi-directional tap provides a wide band width signal coupling, such as from 500 kilohertz (KHz) to 30 megahertz (MHz), with the appropriate amount of RF energy from the main trunk cable to each tap port and with a minimum insertion loss introduced into the main trunk cable.

The present invention also is characterized by improved transmission line impedance matching, so as to minimize any reflection that may occur along any point of the medium. There is also provided well-maintained isolation loss between tap ports. This parameter minimizes adjacent device interference on the same network and improves the reliability of the device.

Figure 1:
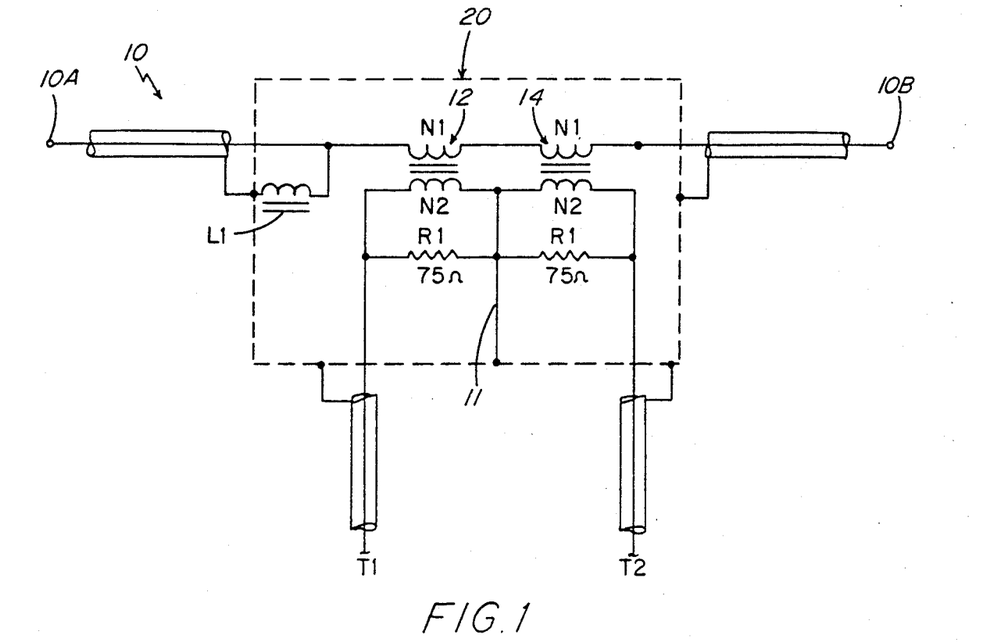
FIG. 1 illustrates a two port embodiment of the present invention.
Figure 2:
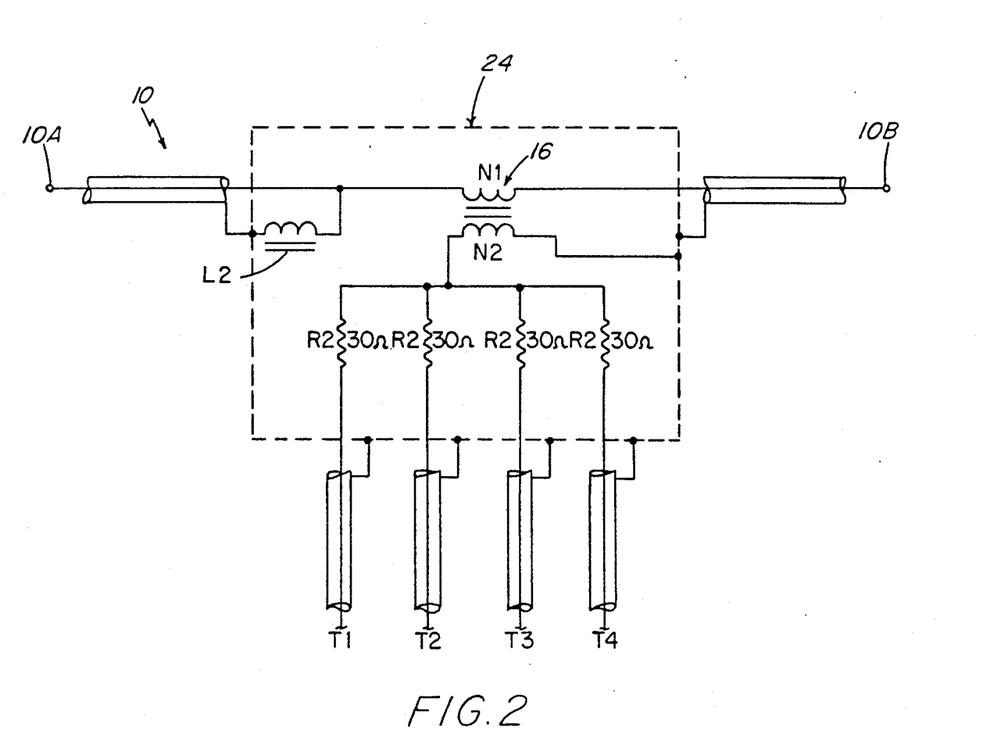
FIG. 2 illustrates a four port embodiment of the present invention.

Reference is now made to FIG. 1 for an illustration of the first embodiment of the present invention, which is a two port coupler 20. FIG. 2 illustrates a second embodiment of the invention, which is a four port coupler 24. In FIGS. 1 and 2, there is illustrated the communication cable 10 with each of the circuits having an input terminal 10A and an output terminal 10B. Both of the circuits of FIGS. 1 and 2 employ transformer coupling that provides greater reliability and improved performance.

In FIG. 1, the coupler 20 has a pair of output tap ports identified as T1 and T2. In FIG. 2, this is a four port device; thus, there are illustrated four tap ports, identified in FIG. 2 as T1, T2, T3 and T4.

In the embodiment of FIG. 1, there are provided two core transformers 12 and 14. The primary winding N1 of each transformer is coupled in the cable 10. The secondary winding of each transformer couples to the respective output tap ports T1 and T2. Associated with each of the secondary windings N2 is a termination resistor R1. The resistors R1 are shown coupled in parallel to the secondary windings. There is also a common lead 11 that ties the windings N2 and resistors R1 to shield ground.

FIG. 1 also illustrates an inductor L1 connected at the input of the coupler. This inductor is used to improve frequency dependency of the device impedance matching to the system.

The four port version of the invention, illustrated in FIG. 2, includes a single core transformer 16, having its primary winding N1 disposed in the cable 10. The secondary winding N2 of the transformer 16 connects on one side to the shield ground, and on the other side connects in common to the resistors R2. The resistors R2 are split matching isolation resistors, and couple to each of the output port cables at T1-T4. The circuit of FIG. 2 also includes inductor L2 at the input of the coupler. Inductor L2 provides frequency dependent matching as previously discussed in conjunction with inductor L1.

Figure 3:
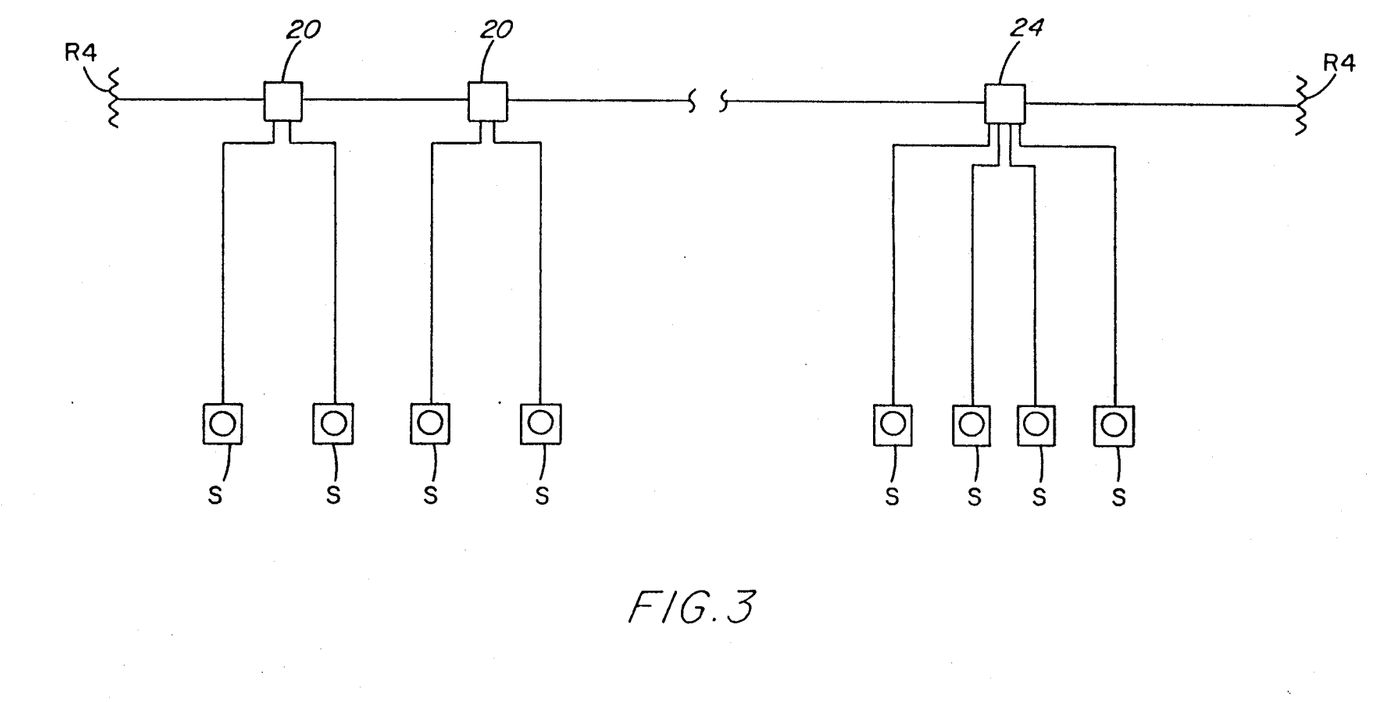
FIG. 3 is a schematic diagram illustrating a system application.

FIG. 3 shows a typical application for the couplers, as used in a multi directional, wide band-width signal coupling arrangement. FIG. 3 shows the termination resistors R4 as well as the separate two port and four port couplers. FIG. 3 illustrates the output taps coupling to the subscriber devices S.

Figure 4:
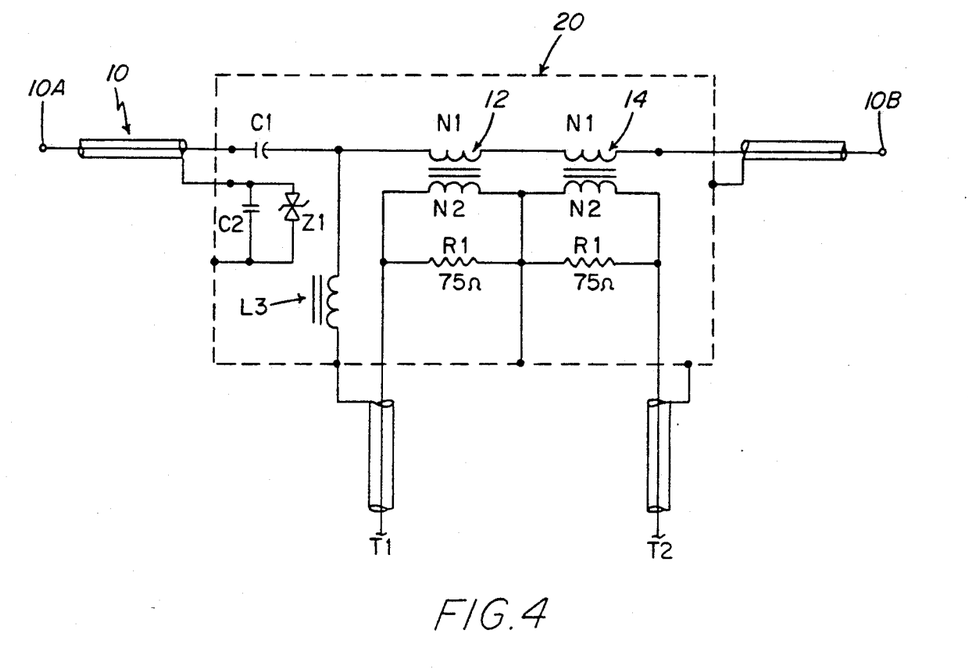
FIG. 4 is an alternate embodiment for the two port version.
Figure 5:
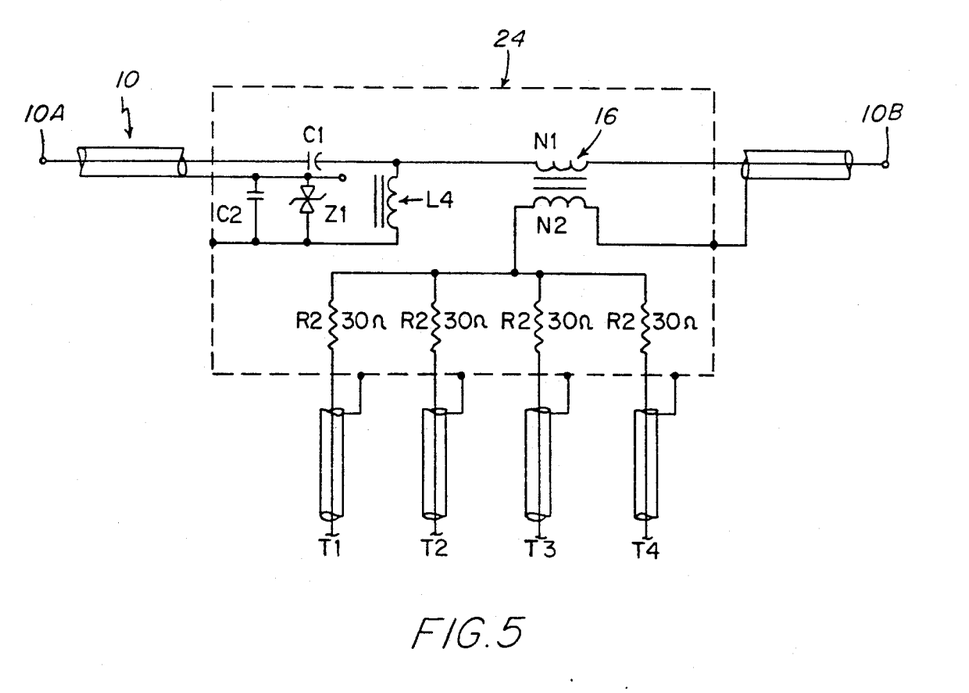
FIG. 5 is an alternate embodiment for the four port version.
Figure 6:
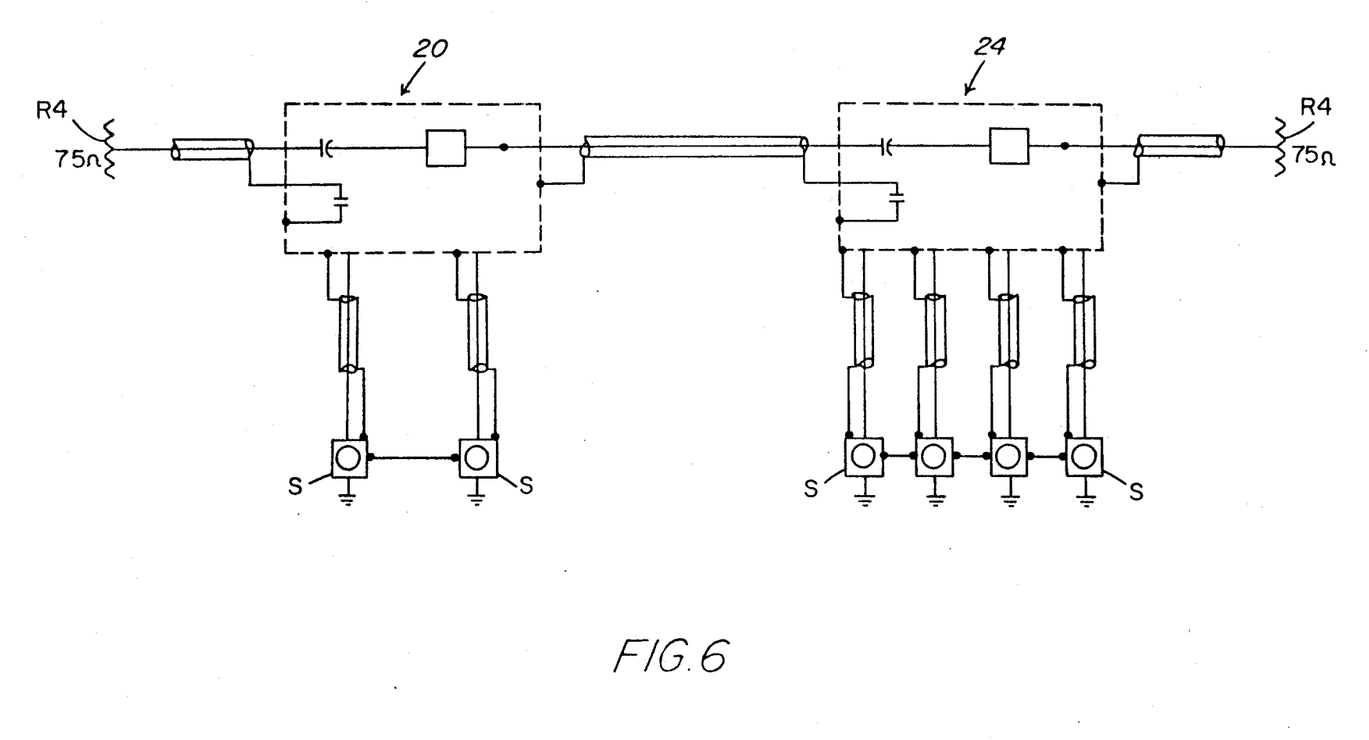
FIG. 6 is a schematic diagram illustrating a system application.

Reference is now made to FIGS. 4-6 for an illustration of further alternate embodiments of the invention. FIG. 4 shows a two port coupler and FIG. 5 shows a four port coupler. It is noted that the construction of the circuits illustrated in FIGS. 4-6 are quite similar to the circuit arrangements illustrated in FIGS. 1-3. However, the couplers illustrated in FIGS. 4 and 5 have additional isolation components associated therewith.

In FIG. 4, there is provided a capacitor C1 in the cable 10, coupling to the transformer primary windings N1. There is furthermore provided a capacitor C2 and associated Zener diode Z1, connected in parallel. This provides ground isolation for a single point grounding application. The capacitors C1 and C2 are isolation capacitors. FIG. 5 also illustrates the capacitors C1 and C2 and the Zener diode Z1 as well as the aforementioned resistors R2. Also note matching inductors L3 and L4 in FIGS. 4 and 5, respectively.

FIG. 6 illustrates a single point grounding application for the couplers of FIGS. 4 and 5. FIG. 6 illustrates the termination resistors R4 as well as the connection of the taps of the coupler to the subscriber devices S.

In connection with the two tap embodiment of the present invention there is now set forth herein a derivation that indicates certain parameters significant in connection, in particular, with the isolation provided by the circuit designs described herein. In this connection refer to the equivalent circuit diagrams of FIGS. 7 and 8. In this connection let $Zs = Z1 = Z1 = Z2 = 75$ ohm and let $E1 = 1$ volt. The following derivations apply:

1) Secondary Load Impedance $$Z4 = \frac{R1 * Z1}{R1 + Z1} = 37.5\Omega \qquad \text{(FIG. 8)}$$

$$Z5 = \frac{R2 * Z2}{R2 + Z2} = 37.5\Omega \qquad \text{(FIG. 8)}$$

2) Primary Winding Impedance $$RP1 = \frac{Z4}{(N2/N1)^2} = 1.5\Omega \qquad \text{(FIG. 8)}$$

$$RP2 = \frac{Z5}{(N2/N1)^2} = 1.5\Omega \qquad \text{(FIG. 8)}$$

3) Trunk Input Impedance $$Z1 = RP1 + RP2 + ZL = 78\Omega$$

4) Trunk Input Voltage Reflection Coefficient $$r1 = \left| \frac{(Z1/Z0) - 1}{(Z1/Z0) + 1} \right| = .0196 \qquad \text{(FIG. 8)}$$

In this derivation note that the inclusion of inductor L1 will introduce a shunt impedance that lowers Z1, hence close to 75 ohms, hence improved trunk return loss.

5) Trunk Return Loss $$20 \, \text{Log}_{10}(r1) = -34.2 \, dB$$

6) Trunk Output Voltage $$E2 = E1 - \left[ (RP1 + RP2) \frac{E1}{[Z0 + RP1 + RP2]} \right] \qquad \text{(FIG. 8)}$$

$$E2 = 962 \, mv$$

7) Insertion Loss (Trunk)

$$IL1 = 20 \, Log_{10}\left(\frac{E2}{E1}\right) = .336 \, dB$$

8) E3 = Secondary Output Voltage
Let N = Secondary Turns/Primary Turns ratio

Using the voltage as the determination factor, and since there are two segments of the circuitry, the turns ratio is determined by the amount of voltage that is inductively coupled from the primary winding to the secondary winding. Since the tap of each port is terminated individually by a single 75 ohm resistor, the voltage is therefore equally divided between the tap and the 75 ohm termination resistor, hence, a loss of $-6$ dB. Therefore, the transformer is really a $-14$ dB transformer:

$$-20 \, dB = (-6 \, dB) + 20 \cdot \log(n1/n2);$$

$$-14/20 = \log(n1/n2)$$

$$n1/n2 = 10^{**}(-0.7) = 0.199 = 0.2$$

A turn of ratio of (n1:n2) of 1:5 is determined.

$$E3 = (1/N2) = 100 \, mv$$

9) IL2 = Trunk to Tap Insertion Loss $$IL2 = 20 \, Log_{10}\left[\frac{E3}{E1}\right] = 20 \, Log_{10}\left[\frac{.100}{1}\right] = -20 \, dB \quad \text{(FIG. 8)}$$

Figure 7:
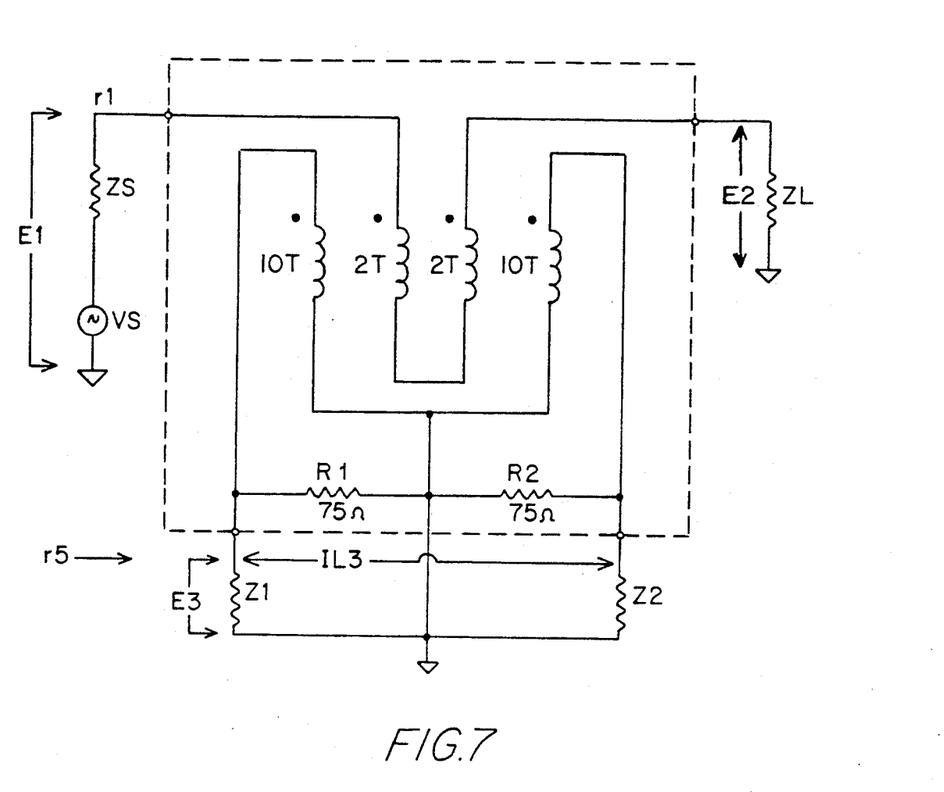
FIGS. 7 and 8 are equivalent circuit diagrams useful in derivations set forth herein.
Figure 8:
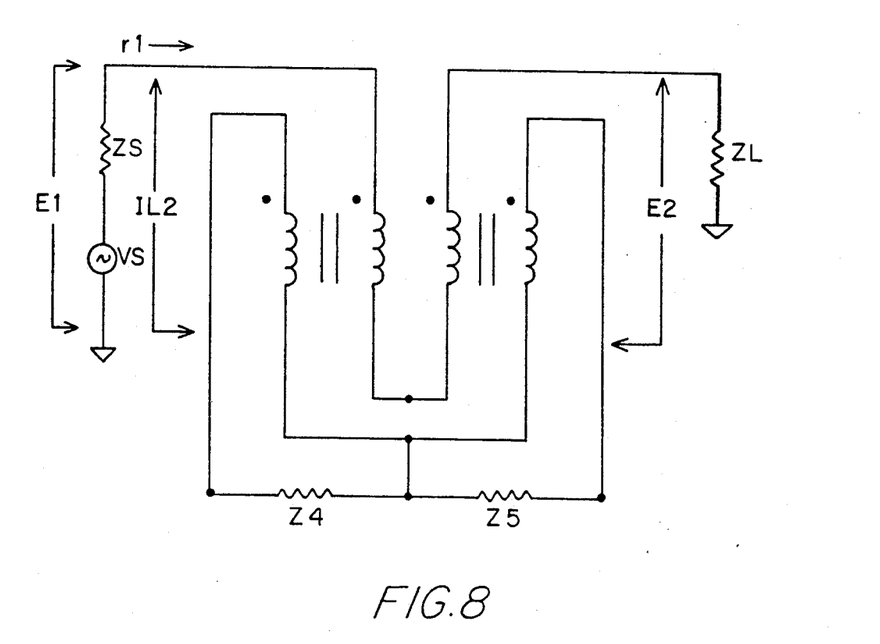

10) R1 = R2 = R shunt matching resistors (per FIG. 7)

$$\begin{aligned} R1 = R2 &= 75/(1 - 1/N^2 * 2) \\ &= 75/(1 - 1/25 * 2) \\ &= 75/(1 - .020) = 76.53\Omega \end{aligned}$$

From a practical standpoint R1 and R2 are selected as 75 ohm resistors as that is within a small percentage of the derived value.

11) ZR5 = Tap Port Input Impedance $$ZR5 = \frac{1}{\left[\frac{1}{(N2/N1)^2 * (Z5 + ZL)}\right] + \left[\frac{1}{R1}\right]}$$

$$ZR5 = 73.53\Omega$$

12) r5 = Tap Port Input Reflection Coefficient $$r5 = \left|\frac{(Z1/ZR5) - 1}{(Z1/ZR5) + 1}\right| = .0099$$

13) VSWR-Tap = Tap Port Return Loss $$VSWR\text{-}Tap = 20 \, Log_{10}[r5] = -40.09 \, dB$$

14) IL3 = Isolation from Tap Port to Tap Port (FIG. 7)

$$IL3 = (2*IL2) = -40 \, dB$$

In connection with the four tap embodiment of the present invention there is now set forth herein a derivation that indicates certain parameters significant in connection, in particular, with the isolation provided by the circuit designs described herein. In this connection refer to the equivalent circuit diagrams of FIGS. 9, 10, 11, and 12 and let $Z_S = Z_L = Z_0 = 75$ ohms as generally described in the transmission line model of FIG. 9(e). The following derivations apply:

Similar to the two port derivation set forth above, the transformer coupled energy is divided among four ports. Therefore, there is a $-12$ dB loss of voltage from the transformer to each tap output. Hence, a $-8$ dB transformer is needed:

$$-0.20 \, dB = (-12 \, dB) + 20 \log(n1/n2)$$

$$-8 \, dB/20 = \log(n1/n2)$$

$$n1/n2 = 10^{**}(-0.4) = 0.398 = 0.4$$

A turn ratio of (n1:n2) of 1:2.5 is determined.

Figure 9A:
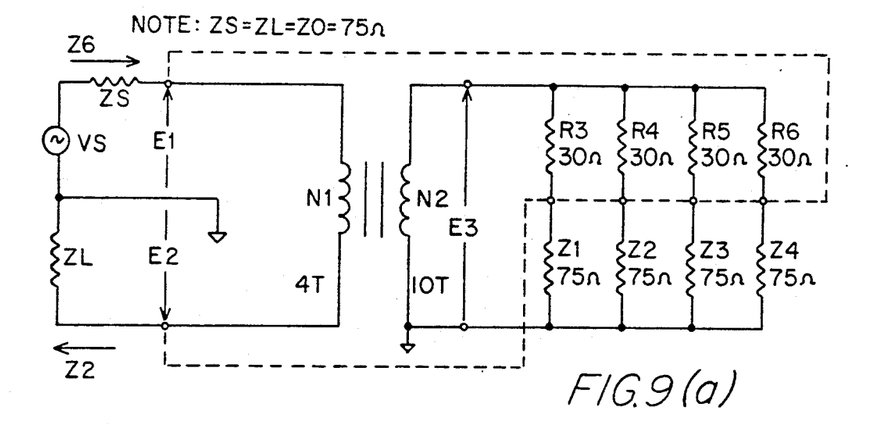
FIGS. 9(a)-9(e), 10(a)-10(d), 11(a)-11(f), 12(a)-12(d) are equivalent circuit diagrams of the four terminal embodiment of the present invention useful in derivations set forth herein.
Figure 9B:
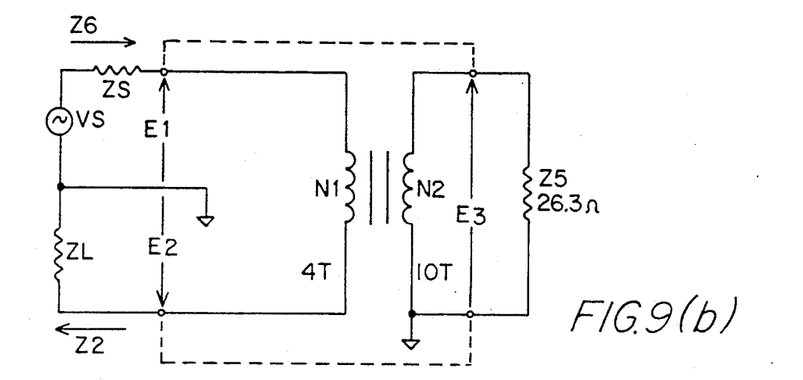

1) Secondary Load Impedance
Let R3 = R4 = R5 = R6 = 30Ω FIG. 9(a)
Z1 = Z2 = Z3 = Z4 = 75Ω FIG. 9(a) then $$Z5 = \frac{1}{\frac{1}{R3 + Z1} + \frac{1}{R4 + Z2} + \frac{1}{R5 + Z3} + \frac{1}{R6 + Z4}} \quad \text{(FIG. 9(b))}$$

$$Z5 = \frac{(R3 + Z1)}{4}$$

$$Z5 = \frac{(30 + 75)}{4} = 26.3\Omega$$

Figures 9C, 9D:
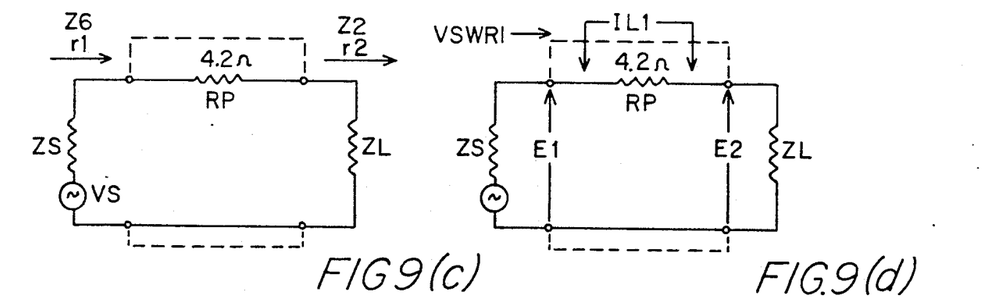
Figure 9E:
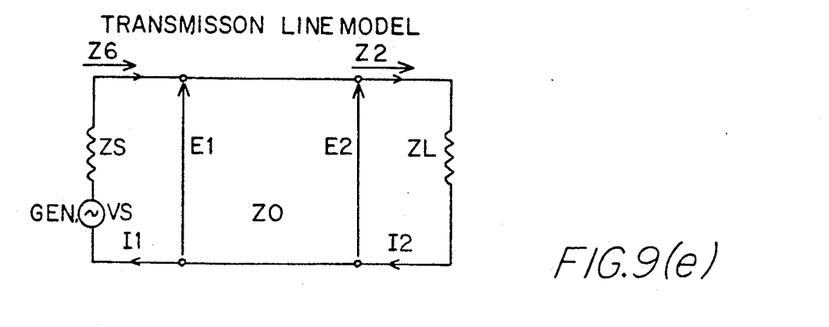

2) RP = Equivalent Series Primary Winding Impedance $$RP = \frac{Z5}{(N2/N1)^2} = 4.2\Omega = \frac{26.3}{(10/4)^2} = \frac{26.3}{(2.5)^2} = \frac{26.3}{6.25} \quad \text{(FIG. 9(c))}$$

3) Z6 = Trunk Input Impedance $$Z6 = \frac{1}{\frac{ZL*R2}{ZL + R2} + RP} + \frac{1}{R1} = 78\Omega \quad \text{(FIG. 9(b))}$$

4) r1 = Voltage Reflection Coefficient $$r1 = \left|\frac{(Z6/ZS) - 1}{(Z6/ZS) + 1}\right| = .0196 \quad \text{(FIG. 9(c))}$$

5) VSWRI = Input Return Loss in Decibels $$VSWRI = 20 \, Log_{10}[r1] = -34.2 \, dB \quad \text{(FIG. 9(d))}$$

6) E2 = Trunk Output (E1 = 1V)
Since R1 >> ZL, and R2 >> ZL $$E2 = E1 - \left[RP\left[\frac{E1}{Z0 + RP}\right]\right] = 9.47 \, volts \quad \text{(FIG. 9(d))}$$

7) IL1 = Trunk Insertion Loss (E1 = 1V)

$$IL1 = 20 \log_{10}\left[\frac{E2}{E1}\right] = -.473 \text{ dB}$$ (FIG. 9(d))

Figure 10A:
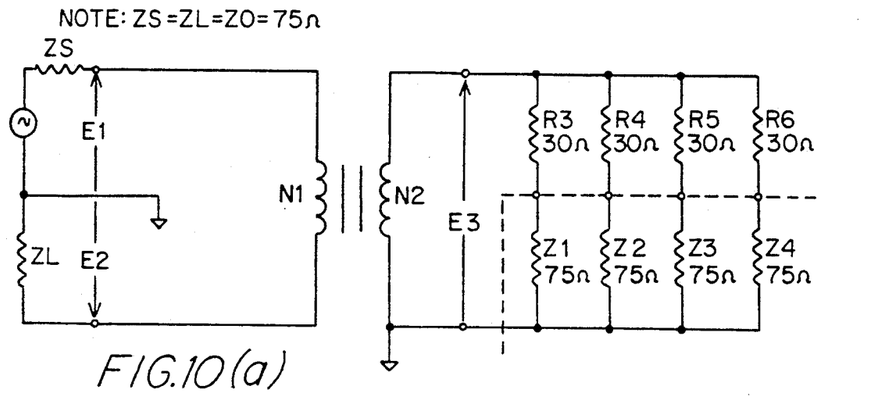

8) E3 = Secondary Output Voltage
Let E1 = 1 volt and ZS = ZL = 75Ω

$$E3 = \frac{E1}{(N2/N1)^2} = \frac{1}{(10/4)^2} = .160 \text{ volts}$$ (FIG. 10(a))

Figure 10B:
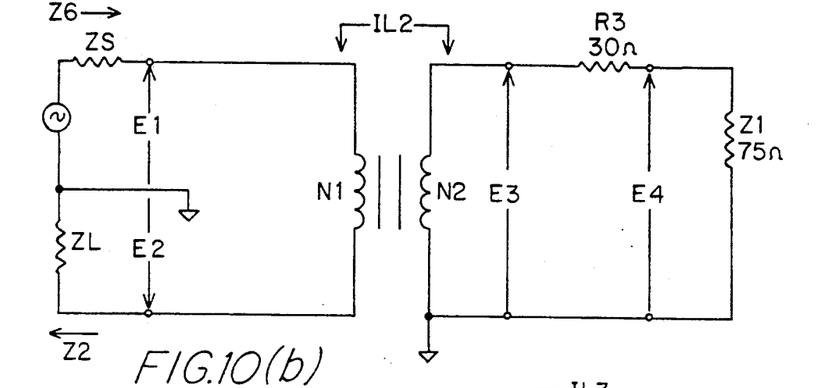

9) IL2 = Coupler Loss in Decibels $$IL2 = 20 \log_{10}\left[\frac{E3}{E1}\right]$$ (FIG. 10(b))

$$IL2 = 20 \log_{10}\left[\frac{.160}{1}\right] = -15.9 \text{ dB}$$

10) E4 = Tap Output Voltage $$E4 = E3\left[\frac{Z1}{R3+Z1}\right] = .160\left[\frac{75}{30+75}\right] = .114 \text{ volts}$$

Figure 10C:
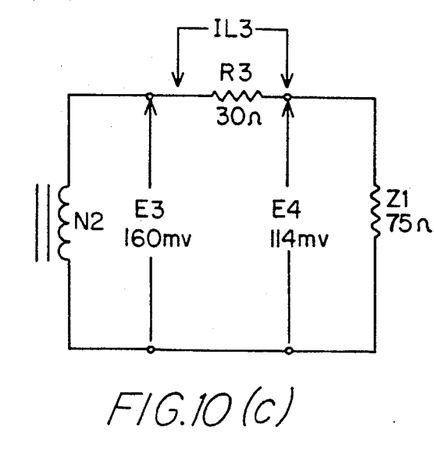

IL3 = Resistive Divider Loss in Decibels $$IL3 = 20 \log_{10}\left[\frac{E4}{E3}\right] = 20 \log_{10}\left[\frac{.114}{.160}\right] = -2.94 \text{ dB}$$ (FIG. 10(c))

Figure 10D:
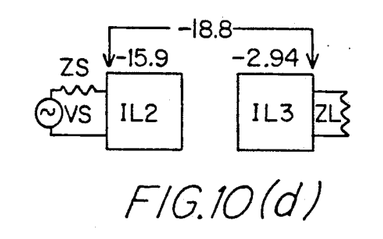

11) Trunk to Tap Loss = IL2 + IL3 = −18.8 dB (FIG. 10(d))

Figure 11A:
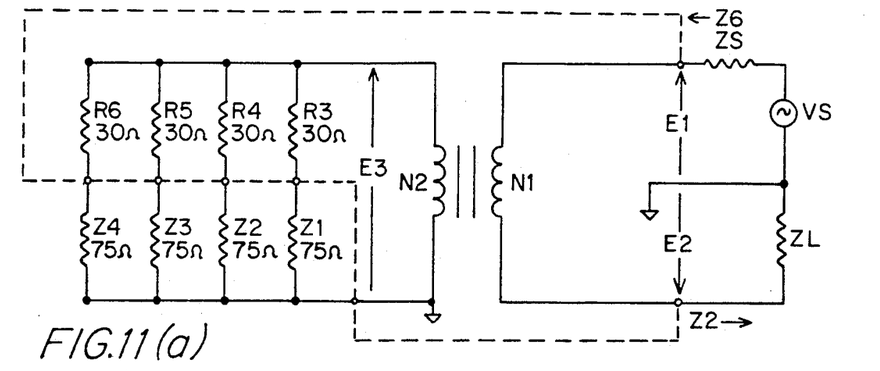
Figure 11B:
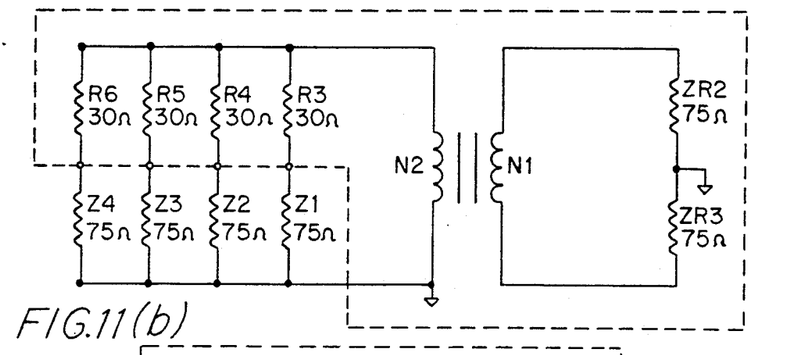

12) Effective Trunk Load and Source Impedance $$ZR2 = \frac{1}{\frac{1}{R1}+\frac{1}{ZS}} = 74.4\Omega,$$ (FIGS. 11(a) and (b))

$$ZR3 = \frac{1}{\frac{1}{R2}+\frac{1}{ZL}} = 74.4\Omega$$ (FIGS. 11(a) and (b))

note that ZR2 and ZR3 are frequency dependent due to the introduction of L2 shunt impedance for better system matching.

Figure 11C:
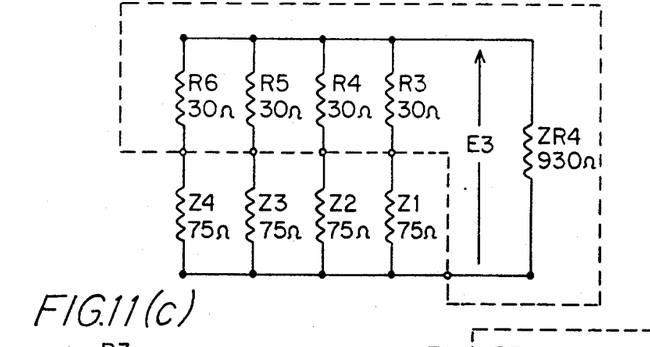

13) Effective Coupling Impedance $$ZR4 = (N2/N1)^{2*}(ZR3+ZR2) = 930\Omega$$ (FIG. 11(c))

Figures 11D, 11E, 11F:
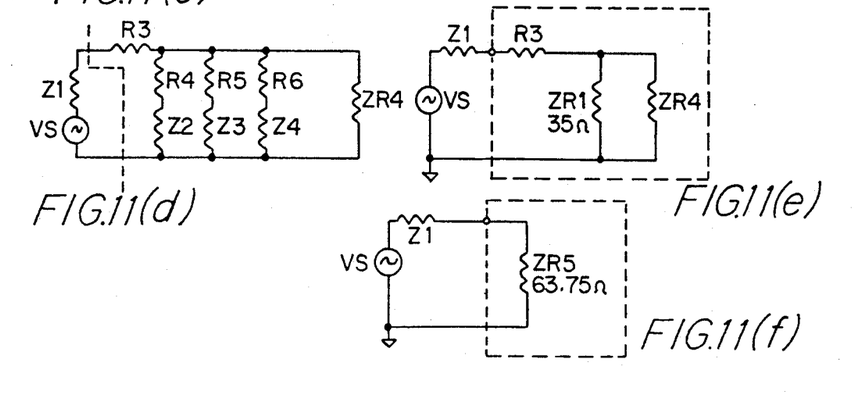

14) ZR1 = Effective Resistance Loading $$ZR1 = \frac{1}{\frac{1}{R4+Z2}+\frac{1}{R5+Z3}+\frac{1}{R6+Z4}} = 35\Omega$$ (FIG. 11(d) and (e))

15) ZR5 = Tap Port Input Impedance $$ZR5 = \frac{1}{\frac{1}{ZR4}+\frac{1}{ZR1}} + R3 = 63.75\Omega$$ (FIG. 11(f))

16) r5 = Tap Port Input Reflection Coefficient $$r5 = \left|\frac{(Z1/ZR5)-1}{(Z1/ZR5)+1}\right| = .081$$

17) VSWR-Tap = Tap Port Return Loss $$VSWR\text{-}Tap = 20 \log_{10}[r5] = -21.8 \text{ dB}$$

Figure 12A:
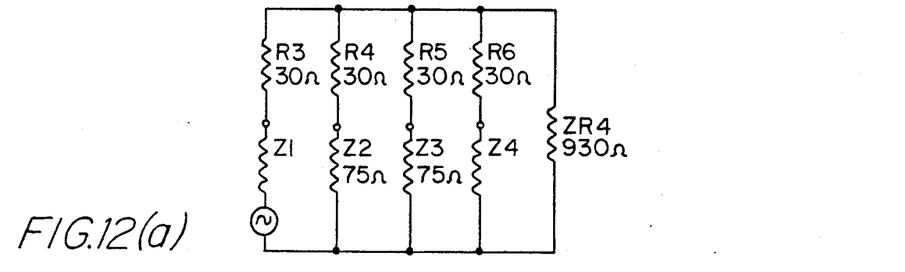
Figure 12B:
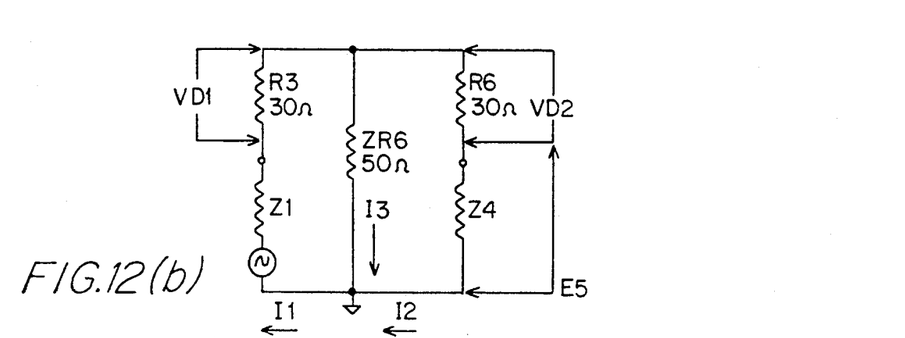

18) ZR6 = Intermediate Impedance Value $$ZR6 = \frac{1}{\frac{1}{ZR4}+\frac{1}{Z3+R5}+\frac{1}{Z2+R4}}$$ (FIGS. 12(a) and (b))

$$= \frac{1}{\frac{1}{930\,\Omega}+\frac{1}{75+30}+\frac{1}{75+30}} = 49.69\,\Omega$$

Figure 12C:
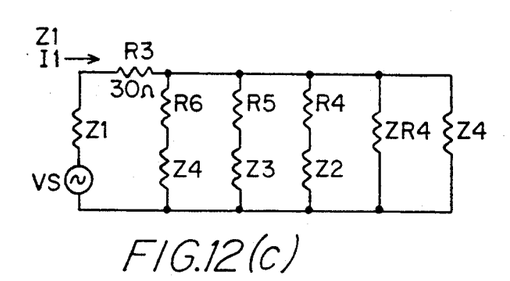
Figure 12D:
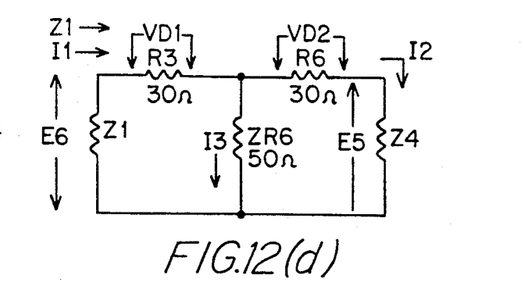

19) Branch Currents I1, I2, I3 Let E6 = 1V, ZR5 = 63.75Ω

$$I1 = \frac{E6}{ZR5} = 15.7 \text{ MA}$$ (FIG. 12(c))

$$I3 = \frac{E6-(R3*I1)}{ZR6} = 10.6 \text{ MA}$$

$$I2 = I1 - I3 = 5.1 \text{ MA}$$

$$VD1 = I1*R3 = .471 \text{ MV}$$ (FIG. 12(d))

$$VD2 = I2*R6 = .153 \text{ MV}$$

20) E5 = Tap Port Output Voltage $$E5 = 1 - (VD1 + VD2) = 0.376 \text{ MV}$$ (FIG. 12(b))

21) IL3 = Isolation from Tap Porr to Tap Port $$IL3 = 20 \log_{10}\left[\frac{E5}{E6}\right] = -8.5 \text{ dB}$$ (FIG. 12(d))

Figure 13:
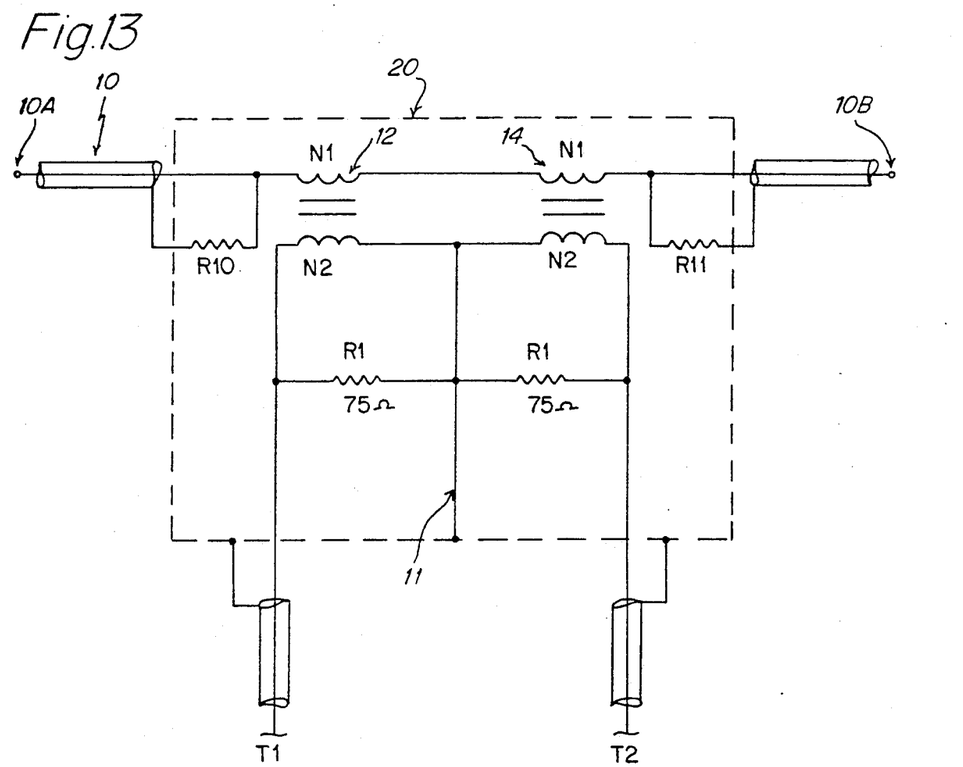
FIG. 13 is an alternate embodiment for the two port version.
Figure 14:
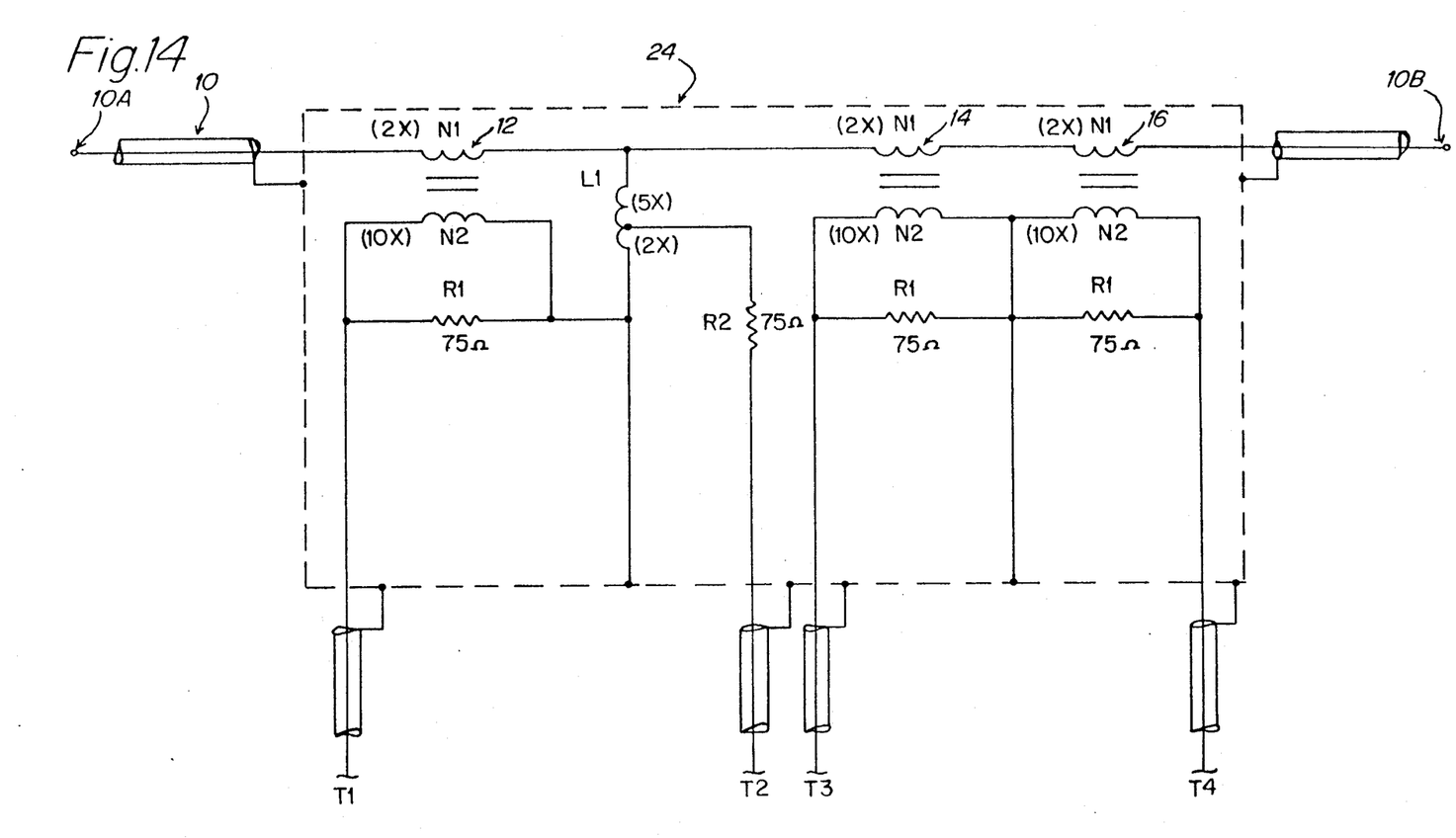
FIG. 14 is an alternate embodiment for the four port version.

Reference is now made to FIGS. 13-14 for an illustration of further alternate embodiments of the invention. FIG. 13 shows a two port coupler and FIG. 14 shows a four port coupler. It is noted that the construction of the circuits illustrated in FIGS. 13-14 are quite similar to the circuit arrangements illustrated in FIGS. 1-2. The couplers illustrated in FIGS. 13-14, however, have a different arrangement of isolation components associated therewith.

In FIGS. 13 and 14, there is illustrated the communication cable 10 with each of the circuits having an input terminal 10A and an output terminal 10B. Both of the circuits of FIGS. 13 and 14 employ transformer coupling that provides greater reliability and improved performance.

In FIG. 13, the coupler 20 has a pair of output tap ports identified as T1 and T2. In FIG. 14, it being a four port device, there are illustrated four tap ports, identified in FIG. 14 as T1-T4.

In the embodiment of FIG. 13, there are provided two core transformers 12 and 14. The primary winding $N_1$ of each transformer is coupled in the cable 10. The secondary winding $N_2$ of each transformer couples to the respective output tap ports T1 and T2. Associated with each of the secondary windings $N_2$ is a termination resistor R1. The resistors R1 are shown coupled in parallel to the secondary windings. There is also a common lead 11 that ties the windings N2 and resistors R1 to shield ground. These features are all identical to the embodiment illustrated in FIG. 1.

FIG. 13 also illustrates resistors R10 and R11 connected at the input and output terminals of the coupler. These resistors are used to improve frequency dependency of the device impedance matching to the system. Unlike the embodiment in FIG. 1, which employs an inductor L1 connected at the input of the coupler, this embodiment employs two resistors R10 and R11 for the same purpose.

The four port alternate embodiment, illustrated in FIG. 14, includes three single core transformers, 12, 14 and 16, having their primary windings N1 disposed in the cable 10. The secondary windings N2 of the transformers 12, 14 and 16 are coupled to respective output tap ports T1, T3, and T4. Shunt inductor L1 is coupled to the communication cable 10 between transformer 12 and transformer 14. Resistor R2 is a split matching isolation resistor which couples to the shunt inductor L1 on one side and to output port T2 on the other side.

It is noted in FIG. 14 that the value of the primary and secondary windings for the transformers 12, 14 and 16 are illustrated in parenthesis. The primary windings N1 have a value of 2X and the secondary windings N2 have a value of 10X. In addition, the value of the windings of the shunt inductor L1 are also illustrated in parenthesis. The windings of the shunt inductor L1 between the communication cable 10 and the node where the split matching isolation resistor R2 is coupled to it, are valued at 5X and the windings after that node are valued at 2X.

Having now described a limited number of embodiments of the present invention, it should be apparent to those skilled in the art that numerous other embodiments and modifications thereof are contemplated as falling within the scope of the present invention as defined by the appended claims.

What is claimed is:

1. A low frequency multi port signal coupler for intercoupling with a communication line and separate utilization devices, said low frequency multi port signal coupler having a pair of terminals coupled to said communication line, a pair of output taps coupled to at least one utilization device, a pair of resistors coupled to the communication line at said terminals, a pair of transformers, each of said transformers having primary and secondary windings, said pair of primary windings being coupled to said communication line in series between said pair of terminals, and termination resistor means coupling said secondary windings to said output taps.

2. A low frequency multi port signal coupler set forth in claim 1 wherein the termination resistor means comprises a pair of termination resistors and means coupling the pair of termination resistors in parallel with the secondary windings of said pair of transformers.

3. A low frequency multi port signal coupler set forth in claim 2 further including means coupling one side of the secondary windings and one side of the pair of termination resistors to a circuit common.

4. A low frequency multi port signal coupler set forth in claim 2 wherein each of the termination resistors couples to an output tap.

5. A low frequency multi port signal coupler set forth in claim 3 wherein each of the termination resistors couples to an output tap.

6. A low frequency multi-port signal coupler as set forth in claim 4 wherein the turns ratio for each transformer is on the order of 1:5.

7. A low frequency multi-port signal coupler set forth in claim 5 wherein the turns ratio for each transformer is on the order of 1:5.

8. A low frequency multi-port signal coupler for intercoupling with a communication line and separate utilization devices, said low frequency multi port signal coupler having a pair of terminals coupled to said communication line, four output taps coupled to at least one utilization device, three transformers, each of said transformers having primary and secondary windings, said primary windings being coupled to said communication line in series between said pair of terminals, a shunt inductor having one end coupled to said communication line between said pair of terminals, and termination resistor means coupling said secondary windings and said shunted inductor to respective output taps.

9. A low frequency multi port signal coupler as set forth in claim 8 wherein the termination resistor means comprises three termination resistors and means coupling said three termination resistors in parallel with the secondary windings of said three transformers, and a split-matching isolation resistor coupled with said shunt inductor.

10. A low frequency multi port signal coupler as set forth in claim 9 wherein each of the four resistors couples to an output tap.

11. A low frequency multi port signal coupler as set forth in claim 10 wherein one side of said split matching isolation resistor is coupled to said shunted inductor and the other side of said split matching isolation resistor is coupled to one of said four output taps.

12. A low frequency multi port signal coupler as set forth in claim 11 wherein the turns ratio for each transformer is on the order of 1:5.

13. In combination, a communication line having input and output sides and a low frequency multi port signal coupler for intercoupling with the communication line and separate utilization devices, said multi-port signal coupler having a first pair of terminals for intercoupling in said communication line and at least a second pair of output taps, said output taps coupled to at least one utilization device, said multi-port signal coupler including a pair of transformers each having primary and secondary windings and with the pair of primary windings coupled in series between said first pair of terminals, termination resistor means coupling from said secondary winding to said output taps, and at least one resistor means coupled to one of the terminals of the communication line.

14. The combination as set forth in claim 13 including a pair of resistor means coupled respectively to said pair of terminals.

15. A low frequency multi port signal coupler for intercoupling with a communication line and separate utilization devices, said low frequency multi port signal coupler including a first pair of terminals for intercoupling in said communication line and at least a second pair of taps, a pair of coupling transformers, each having primary and secondary windings, means coupling the primary windings in series between said pair of terminals, at least one pair of termination resistors, means for coupling one side of each of the termination resistors to a respective output tap and the other side of each of the termination resistors to the secondary windings, said output tap associated with each termination resistor coupled to a terminal of a utilization device, and at least one resistor means coupled to one of the terminals of the communication line.

16. A multiport signal coupler as set forth in claim 15 including a pair of resistor means coupled respectively to said pair of terminals.

17. In combination, a communication line having input and output sides and a low frequency multi port signal coupler for intercoupling with the communication line and separate utilization devices, said multi-port signal coupler having a pair of terminals for intercoupling in said communication line and at least a pair of output taps, said output taps coupled to at least one utilization device, said multi-port signal coupler including a pair of transformers each having primary and secondary windings and with the pair of primary windings coupled in series between said first pair of terminals, termination resistor means coupling from said secondary winding to said output taps, and a shunt inductor means having one end coupled to said communication line between said pair of terminals.

18. The combination as set forth in claim 17 wherein said termination resistor means comprises at least two terminating resistors and means coupling said terminating resistors in parallel with the respective secondary windings of said transformers.

19. The combination as set forth in claim 18 further including an isolation resistor coupled from said shunt inductor to an additional output tap.

20. The combination as set forth in claim 19 including a total of four output taps and three transformers, each of the secondary windings of the transformers having a terminator resistor coupled thereacross.

* * * * *